United States Patent
Tateyama et al.

(10) Patent No.: US 6,834,210 B2
(45) Date of Patent: Dec. 21, 2004

(54) SUBSTRATE PROCESSING SYSTEM AND SUBSTRATE PROCESSING METHOD

(75) Inventors: Masanori Tateyama, Kumamoto-Ken (JP); Akira Miyata, Kumamoto-Ken (JP)

(73) Assignee: Tokyo Electron Limited, Tokyo-To (JP)

(*) Notice: Subject to any disclaimer, the term of this patent is extended or adjusted under 35 U.S.C. 154(b) by 376 days.

(21) Appl. No.: 10/014,855

(22) Filed: Dec. 14, 2001

(65) Prior Publication Data

US 2002/0076306 A1 Jun. 20, 2002

(30) Foreign Application Priority Data

Dec. 14, 2000 (JP) ........................................ 2000-380663

(51) Int. Cl.[7] .............................................. G06F 19/00
(52) U.S. Cl. ........................ 700/100; 700/99; 700/112
(58) Field of Search ........................ 700/121, 99, 100, 700/228, 112

(56) References Cited

U.S. PATENT DOCUMENTS

| | | | |
|---|---|---|---|
| 5,436,848 A | 7/1995 | Nishida et al. | 700/112 |
| 5,849,602 A | 12/1998 | Okamura et al. | 438/5 |
| 6,147,329 A | 11/2000 | Okamura et al. | 219/390 |
| 2001/0051837 A1 * | 12/2001 | Tateyama et al. | 700/112 |

FOREIGN PATENT DOCUMENTS

| | | |
|---|---|---|
| JP | 5-251337 | 9/1993 |
| JP | 7-171478 | 7/1995 |
| JP | 10-284574 | 10/1998 |
| JP | 2000-331959 | 11/2000 |
| WO | WO 00/79356 | 12/2000 |

* cited by examiner

Primary Examiner—Leo Picard
Assistant Examiner—Ryan Jarrett
(74) Attorney, Agent, or Firm—Oblon, Spivak, McClelland, Maier & Neustadt, P.C.

(57) ABSTRACT

A substrate-processing system has several processing units, a loading/unloading section for transferring wafers to be processed to each unit and taking out processed wafers from each unit and a sub-arm mechanism for receiving/transferring the substrates from/to the loading/unloading section and transferring the substrates one by one to each unit. The processing units and the sub-arm mechanism are controlled by a controller so that each unit processes the substrates one by one in accordance with a one-cycle time that is the maximum period among periods t1/m to tn/m obtained by dividing periods t1 to tn by the number "m" of identical units of each processing unit. The controller sets a pre-waiting time (before processing) for each processing unit.

12 Claims, 13 Drawing Sheets

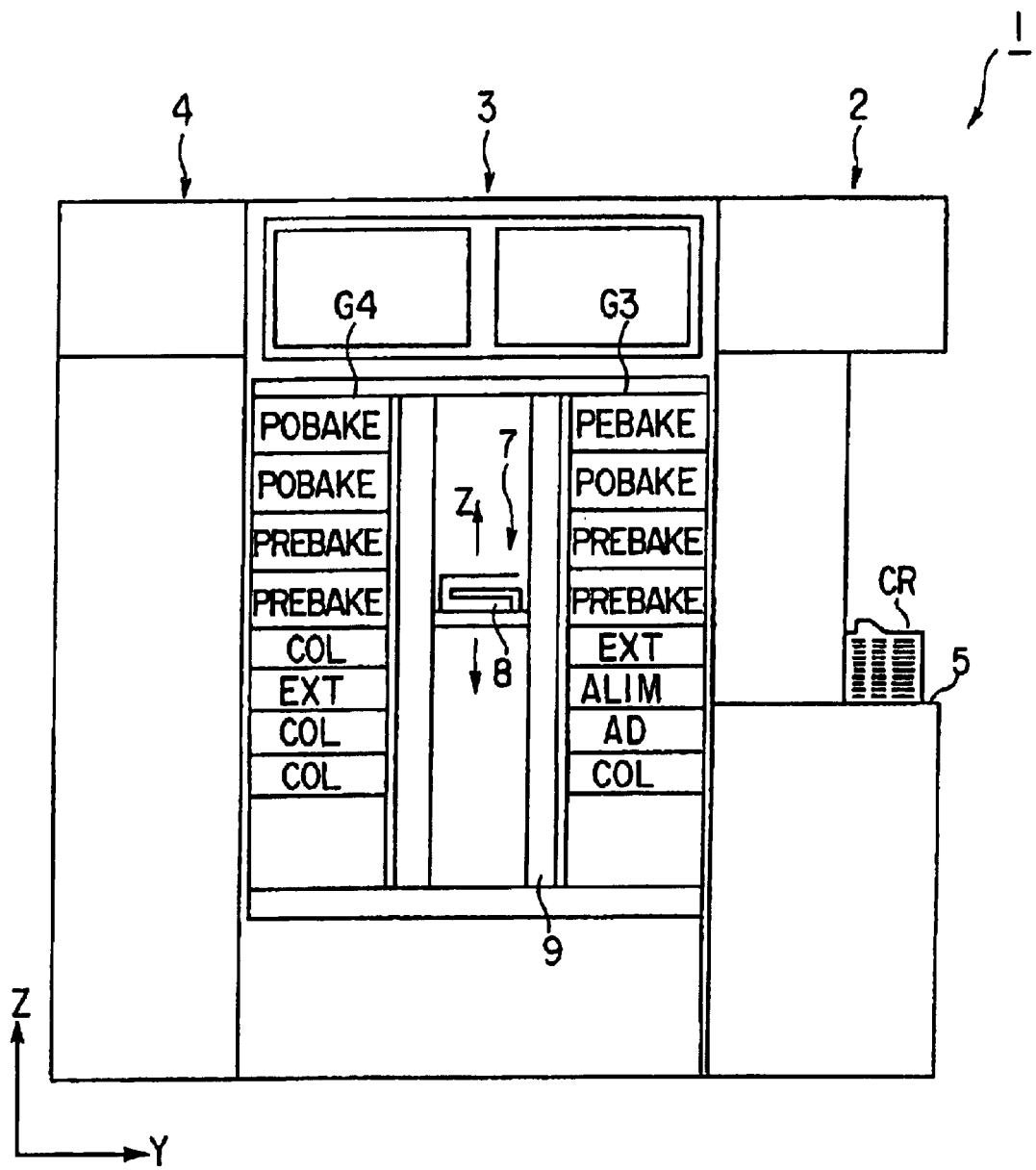
F I G. 3

| G1 | G2 | G3 | G4 |
|---|---|---|---|
| DEV1 | DEV2 | POBAKE1 | PEBAKE |
| COT1 | COT2 | POBAKE2 | POBAKE3 |
|  |  | PREBAKE1 | PREBAKE3 |
|  |  | PREBAKE2 | PREBAKE4 |
| EXP |  | COL1 | EXT |
|  |  | EXT | ALIM |
|  |  | COL1 | AD |
|  |  | COL2 | COL4 |
|  |  | COL3 |  |

FIG. 4

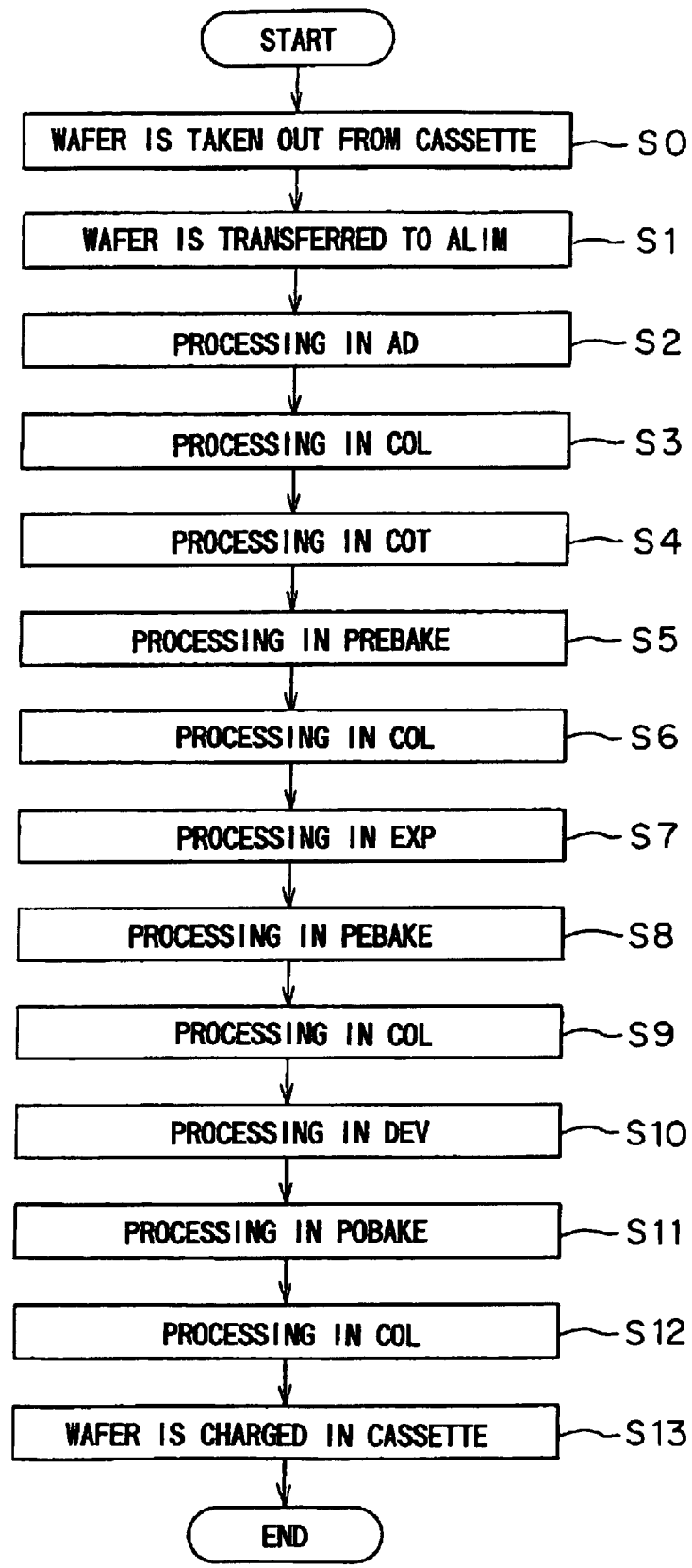
F I G. 6

| STEP | PROCESSING UNITS |
|---|---|
| S1 | ALIM |
| S2 | AD |
| S3 | COL |
| S4 | COT |
| S5 | PREBAKE |
| S6 | COL |
| S7 | EXP |
| S8 | PEBAKE |
| S9 | COL |
| S10 | DEV |
| S11 | POBAKE |
| S12 | COL |

FIG. 7

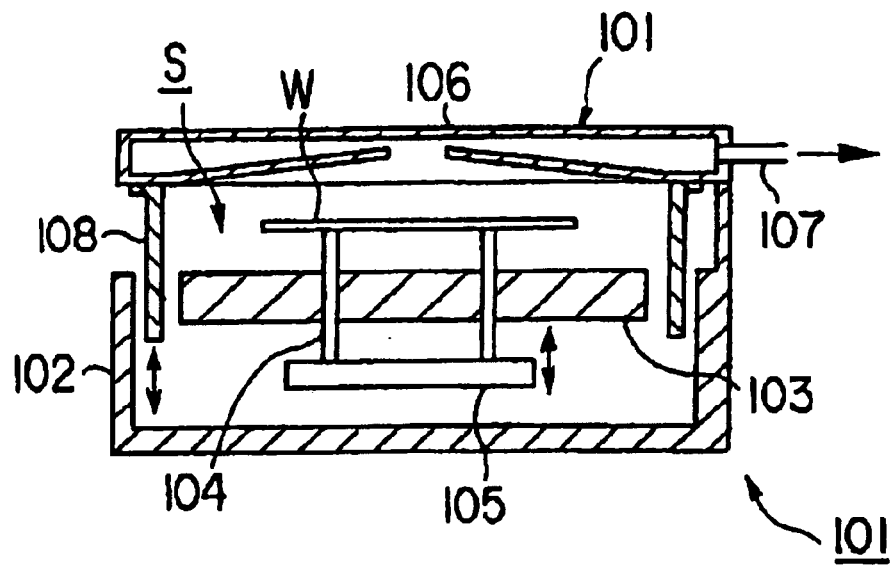
F I G. 8A
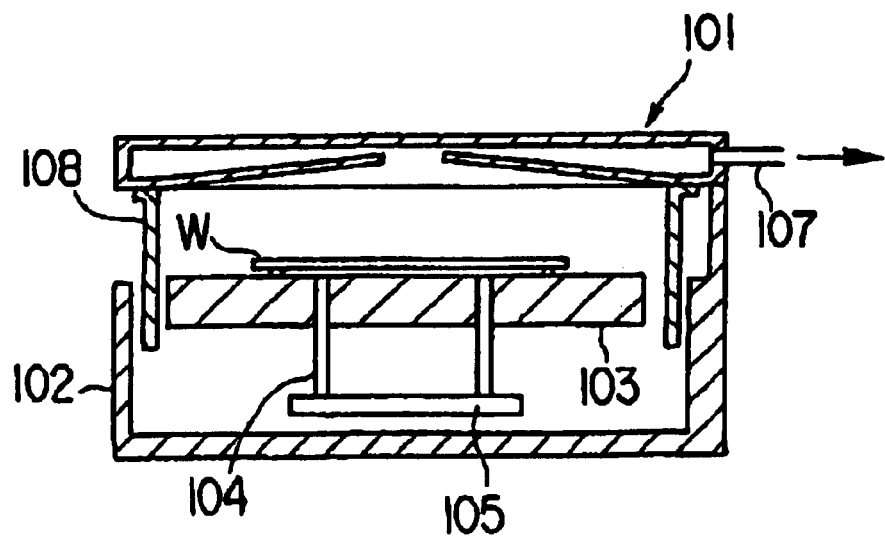
F I G. 8B

SUBSTRATE PROCESSING SYSTEM AND SUBSTRATE PROCESSING METHOD

BACKGROUND OF THE INVENTION

The present invention relates to a substrate processing system and a substrate processing method for performing a series of processes to several types of substrates such as semiconductor wafers and glass substrates used for liquid crystal displays.

Micro circuit patterns are formed by photolithography in fabrication of glass substrates used for liquid crystal displays (LCD substrates) and semiconductor devices, etc.

A circuit pattern is formed in photolithography by applying a resist on a substrate such as an LCD substrate and a semiconductor wafer and forming the resist film followed by exposure to the pattern, development and etching.

Photolithographic systems for handling several wafers have been developed in recent trend of large diameter for semiconductor wafers. A complex processing system capable of resist-application and development, for example, takes out wafers one by one from a cassette into a processing unit in which the wafers are processed one by one, and the processed wafers are returned to the cassette one by one.

A processing time for each of several units in this complex processing system is called one cycle. The system cannot proceed to the next processes until the previous processes are completed in every unit for one cycle.

Therefore, in a complex processing system that transfers a wafer to the next processing unit after the previous process has been completed, a process to be performed by the present unit is susceptible to the process performed by the previous unit, or the present unit has to wait for the completion of the previous processing (called waiting-time consumption).

In a series of processing, such as, baking, cleaning and development performed in this order, the developing process requires a relatively long processing time. Due to long developing process time, a wafer for which the baking and cleaning processes have been completed has to remain in the baking or the cleaning unit to wait for completion of the developing process to the previous wafer. A wafer will be over-baked when it remains in the baking unit for such a long time.

A thermal processing time is precisely controlled in wafer processing recently. Such over-baking for a period longer than a controlled time, however, varies pattern width formed through a resist. Desired patterns thus cannot be formed.

SUMMARY OF THE INVENTION

In order to solve the problem discussed above, a purpose of the present invention is to provide a substrate processing apparatus that reduces effects of waiting time unnecessarily consumed (rate controlling) by any processing unit.

The present invention provides a substrate processing system including first to n-th processing units (n=1, 2, . . . , N) each having at least one identical unit for performing first to n-th wafer-processing for given periods t1 to tn, respectively, the processing being performed in order from the first unit to the n-th unit, a plurality of substrates being simultaneously processed by different types of the processing units for one cycle, the system including: a loading/unloading section for taking in and out the substrates; a first transfer section for receiving/transferring the substrates from/to the loading/unloading section and transferring the substrates one by one to each processing unit; and a controller for controlling the first transfer section and the processing units so that each processing unit processes the substrates one by one in accordance with one-cycle time as a standard time, the one-cycle time being the maximum period among periods t1/m to tn/m obtained by dividing the periods t1 to tn by the number "m" of the identical units of the first to n-th processing units.

In this substrate processing system according to the present invention, the controller may control the first transfer section and the processing units so that the processing time required for each processing unit corresponds to the one-cycle time. The processing time required for each processing unit may include a pre-transfer time, a net processing time, a post-transfer time and a plurality of waiting times. The waiting times may be allocated before or after one of the pre-transfer time, the net processing time and the post-transfer time in the processing time required for each processing unit.

In this substrate processing system according to the present invention, the controller may control the first transfer section and the processing units so that the processing time required for each processing unit corresponds to division of the one-cycle time by an integer. The processing time required for each processing unit may include at least a pre-transfer time, a net processing time and a post-transfer time. The processing time required for a desired processing unit may further include a waiting time.

In this substrate processing system according to the present invention, the controller may control the first transfer section and the processing units so that the total of the processing times for the successive "n" number of processing units equals to one-cycle time×n. The processing time required for each processing unit may include at least a pre-transfer time, a net processing time and a post-transfer time. The processing time required for a desired processing unit may further include a waiting time.

In this substrate processing system according to the present invention, the processing units may include at least one thermal processing unit. The thermal processing unit may have a heating mechanism and a lift-up mechanism for holding each substrate so that the substrate is distant from the heating mechanism, the thermal processing unit waiting for thermal processing while the lift-up mechanism is holding the substrate as distant from the heating mechanism.

In this substrate processing system according to the present invention, the processing units may include at least one developing unit for developing a resist applied onto each substrate.

In this substrate processing system according to the present invention, the processing units may include at least one exposing apparatus for exposing a resist applied onto each substrate.

This substrate processing system according to the present invention may further include a second transfer section provided as accessible to each of the processing units for transferring each substrate from one of the processing units to another.

Moreover, the present invention provides a substrate processing system including first to n-th processing units (n=1, 2, . . . , N) each having at least one identical unit for performing first to n-th wafer-processing for given periods t1 to tn, respectively, the processing being performed in order from the first unit to the n-th unit, a plurality of substrates being simultaneously processed by different type of the processing units for one cycle, the system including:

a loading/unloading section for taking in and out the substrates; a first transfer section for receiving/transferring the substrates from/to the loading/unloading section and transferring the substrates one by one to each processing unit; a second transfer section for receiving/transferring the substrates from/to the processing units; and a controller for controlling the first transfer section, the second transfer section and the processing units, when the substrates are simultaneously processed by the different types of processing units, so that each processing unit processes the substrates one by one within one-cycle time that corresponds at least to either a first total transfer time or a second total transfer time that is larger than the other, the first total transfer time being the total of periods in the one cycle for the first transfer section required for receiving/transferring each substrate from/to the loading/unloading section and transferring the substrate to each processing unit, the second total transfer time being the total of periods in the one cycle for the second transfer section required for receiving/transferring the substrate from/to the processing units.

In this substrate processing system according to the present invention, the controller may calculate the maximum period among periods t1/m to tn/m obtained by dividing the periods t1 to tn by the number "m" of the identical units of the first to n-th processing units and sets the maximum among the maximum period, the first total transfer time and the second transfer time as the one-cycle time for controlling the first and the second transfer sections.

In this substrate processing system according to the present invention, at least one of the processing units may be a substrate-receiving unit for receiving and processing each substrate, the controller calculating the total receiving and processing period for the substrate-receiving unit for receiving and processing each substrate and setting the maximum among the total receiving and processing period, the first total transfer time and the second transfer time as the one-cycle time.

This substrate processing system according to the present invention may further include: an exposing apparatus; and a third transfer section for receiving the substrates from the processing units and transferring the substrates to the exposing apparatus, wherein the controller sets the maximum among the first total transfer time, the second total transfer time and a third total transfer time for the third transfer section required for the one cycle as the one-cycle time.

Moreover, the present invention provides a method of processing substrates with first to n-th processing units (n=1, 2, . . . , N) each having at least one identical unit for performing first to n-th wafer-processing for given periods t1 to tn, respectively, the processing being performed in order from the first unit to the n-th unit, a plurality of substrates being simultaneously processed by different types of the processing units for one cycle, the method including the steps of: processing the substrates one by one in accordance with one-cycle time as a standard time, the one-cycle time being the maximum period among periods t1/m to tn/m obtained by dividing the periods t1 to tn by the number "m" of the identical units of the first to n-th processing units; and performing processing to each substrate in at least one of the processing units with a waiting time.

BRIEF DESCRIPTION OF DRAWINGS

FIG. 3 is a rear view showing the substrate processing system;

FIG. 4 is a schematic view showing processing units that constitute the substrate processing system;

FIG. 6 shows a flow chart for the substrate processing system;

FIG. 7 illustrates data entry to the main panel;

FIGS. 8A and 8B show vertical sections of the substrate processing system;

DETAILED DESCRIPTION OF PREFERRED EMBODIMENTS

Preferred embodiments according to the present invention will be disclosed with reference to the attached drawings.

First Embodiment

Figure 1:
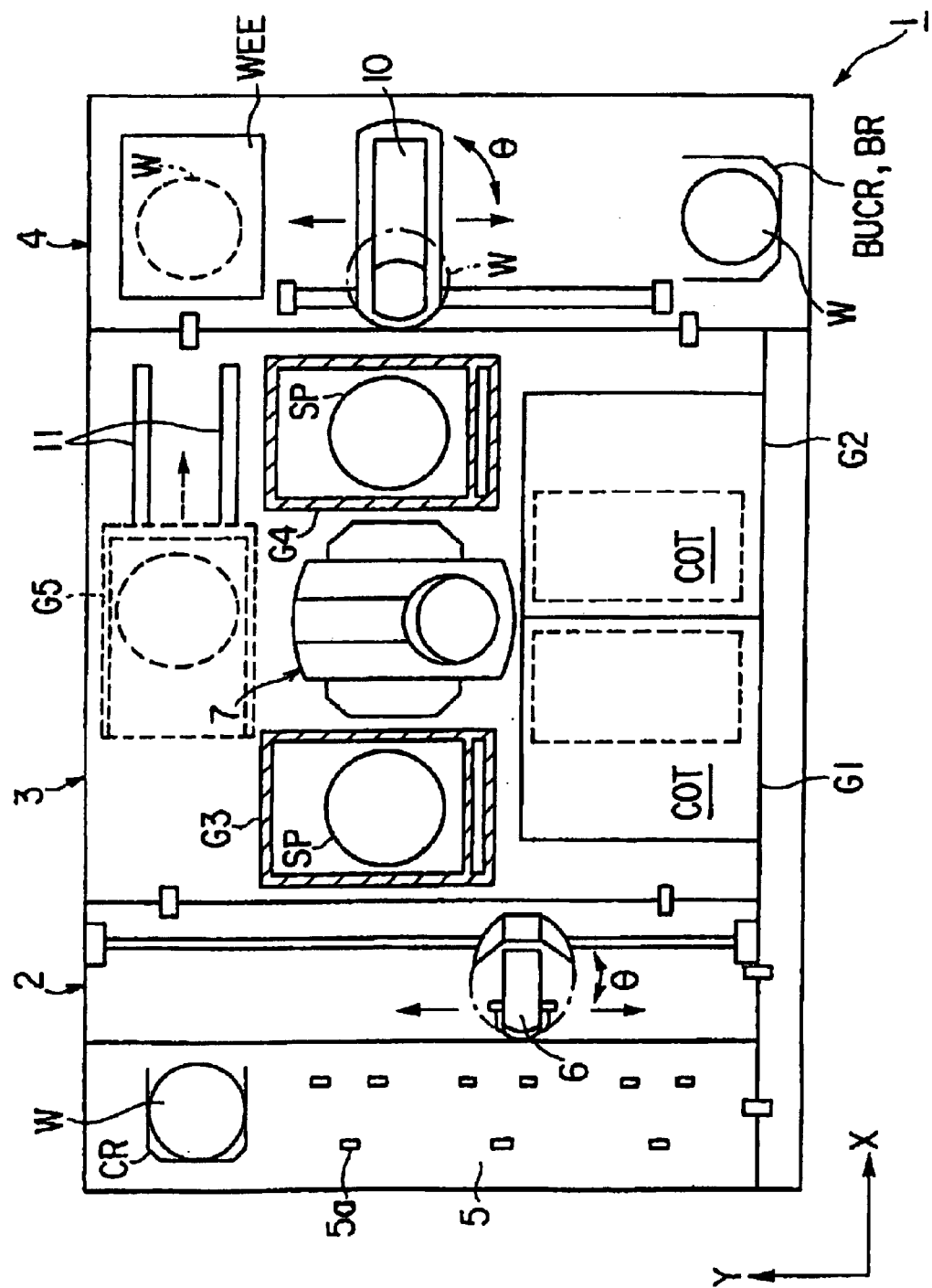
FIG. 1 is a plan view showing the whole structure of a first embodiment of a substrate processing system according to the present invention.
Figure 2:
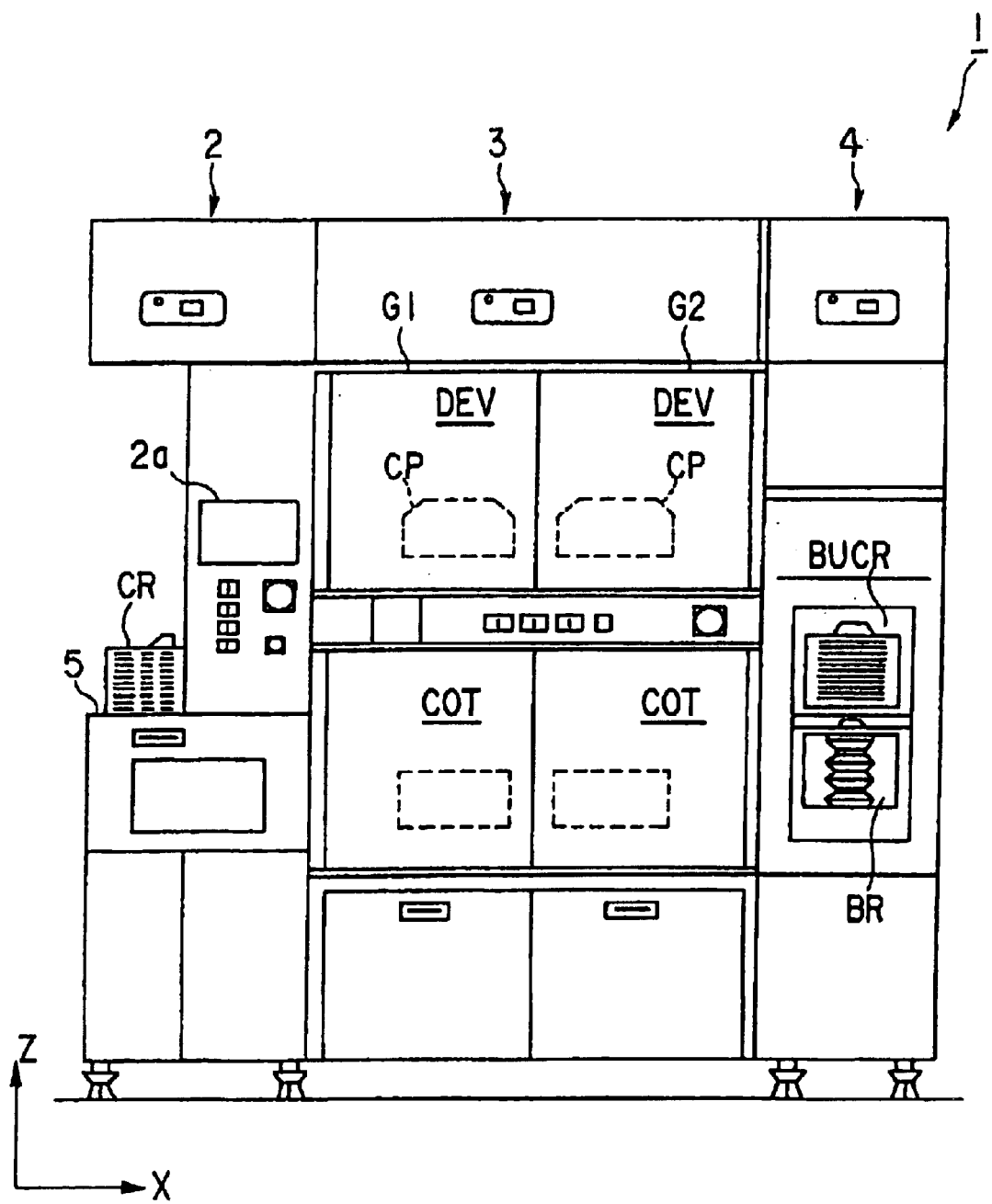
FIG. 2 is a front view showing the substrate processing system.

FIGS. 1 to 5 illustrate a substrate processing system 1 according to the present invention. FIGS. 1, 2 and 3 are a plan view, a front view and a rear view, respectively, showing the whole structure of the substrate processing system 1 without an exposing apparatus 12.

As shown in FIG. 1, the substrate processing system 1 is equipped with a loading/unloading section 2 that takes out wafers W as substrates one by one from cassettes CR that contains several wafers, a processing section 3 having several processing units for performing processes such as resist application and development to each wafer W taken out by the loading/unloading section 2, and an interface section 4 for transferring each resist-applied wafer W to the exposing apparatus 12 as a processing section.

The interface section 4 has a second sub-arm mechanism 10 by which each wafer W is transferred to the exposing apparatus 12. The loading/unloading section 2 has a table 5 on which the cassettes CR are loaded and unloaded while each contains for example 25 semiconductor wafers at a time.

As shown in FIG. 1, several cassettes CR for example four are aligned at positioning protrusions 5a on the table 5 in an X-direction while a wafer inlet/outlet of each cassette CR faces the processing section 3.

A first sub-arm mechanism 6 is a first transfer means that is movable in the cassette-alignment direction (X-direction) and a wafer-alignment direction (Z-direction) for the wafers W contained in the cassettes CR for selective access to each cassette CR.

Moreover, the first sub-arm mechanism 6 is rotatable in a θ-direction so that it transfers each wafer W to a main-arm mechanism 7 as a second transfer means provided in the processing section 3. The mechanism 6 is also accessible to an alignment unit ALIM and an extension unit EXT belonging to a multi-stage section of a third processing-unit group G3 of the processing section 3, as disclosed below.

The wafers W are transferred from the loading/unloading section 2 to the processing section 3 via the third processing-unit group G3. The unit group G3 consists of several processing units stacked as shown in FIG. 3.

In detail, the third processing-unit group G3 consists of a cooling unit COL for cooling the wafers W, an adhesion unit AD for hydrophobic processing for enhanced resist fixability to the wafers W, the alignment unit ALIM for wafer positioning, the extension unit EXT for setting the wafers W in a waiting mode, two pre-baking units PREBAKE for thermal processing before exposure, a post-baking unit POBAKE for thermal processing after development and a post-exposure baking unit PREBAKE for thermal processing after exposure, stacked in this order from the bottom to up.

The wafers W are transferred to the main-arm mechanism 7 via the extension unit EXT and the alignment unit ALIM. As shown in FIG. 1, the main-arm mechanism 7 is surrounded by a first to a fifth processing-unit group G1 to G5 including the third processing-unit group G3. Like the third group G3, each of the unit groups G1, G2, G4 and G5 consists of several stacked processing units.

The main-arm mechanism 7 has a main arm 8, as shown in FIG. 3, that can be elevated in a Z-direction inside a tubular guide 9 extending in a vertical direction. The tubular guide 9 is connected to a rotary shaft of a motor (not shown) so that it rotates with the main arm 8 about the rotary shaft, thus the main arm 8 being rotatable in the θ-direction. Instead, the tubular guide 9 may be connected to another rotary shaft (not shown) rotated by the motor.

As disclosed, the main arm 8 is driven in the vertical direction so that the wafers W can be transferred to any unit in the processing-unit groups G1 to G5.

The fourth processing-unit group G4 consists of, as shown in FIG. 3, two cooling units COL, an extension unit EXT, another cooling unit COL, two pre-baking units PREBAKE and two post-baking unit POBAKE, stacked in this order from the bottom to up.

Figure 13:
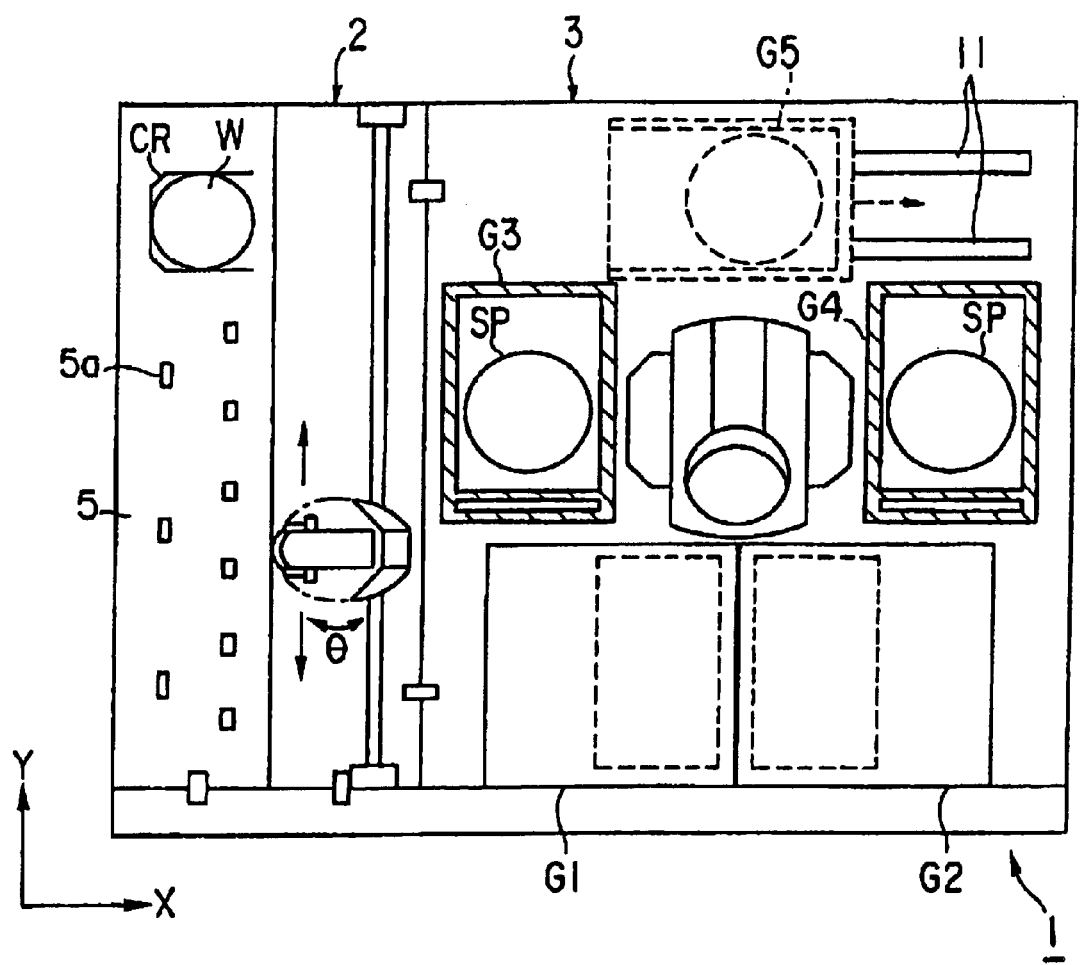
FIG. 13 is a plan view showing the whole structure of a modification to a substrate processing system according to the present invention.

The fifth processing-unit group G5 is provided optionally. It is structured like the fourth processing-unit group G4 in this embodiment. The fifth unit group G5 is movable along rails 11, as shown in FIG. 13, for easy maintenance of the main-arm mechanism 7 and the first to the fourth processing-unit groups G1 to G4.

The present invention achieves drastic reduction in space for system installation when applied to the substrate processing system shown in FIGS. 1 to 3 because of the stacked structure of the processing units.

FIG. 4 is a schematic view showing the processing units for each unit group installed in the substrate processing system. Several units are provided for those requiring a long processing time such as pre-baking units PREBAKE and resist-developing apparatus DEV, as shown in FIG. 4.

Provision of a plurality of identical units each requiring a relatively long processing time reduces unnecessary waiting-time consumption (rate controlling) which may otherwise occur to the entire system. For the same reason, a plurality of identical units such as the cooling units COL are provided for several processes. The identical units are discriminated therebetween with numerals attached to their names such as COT1 and COT2.

Figure 5:
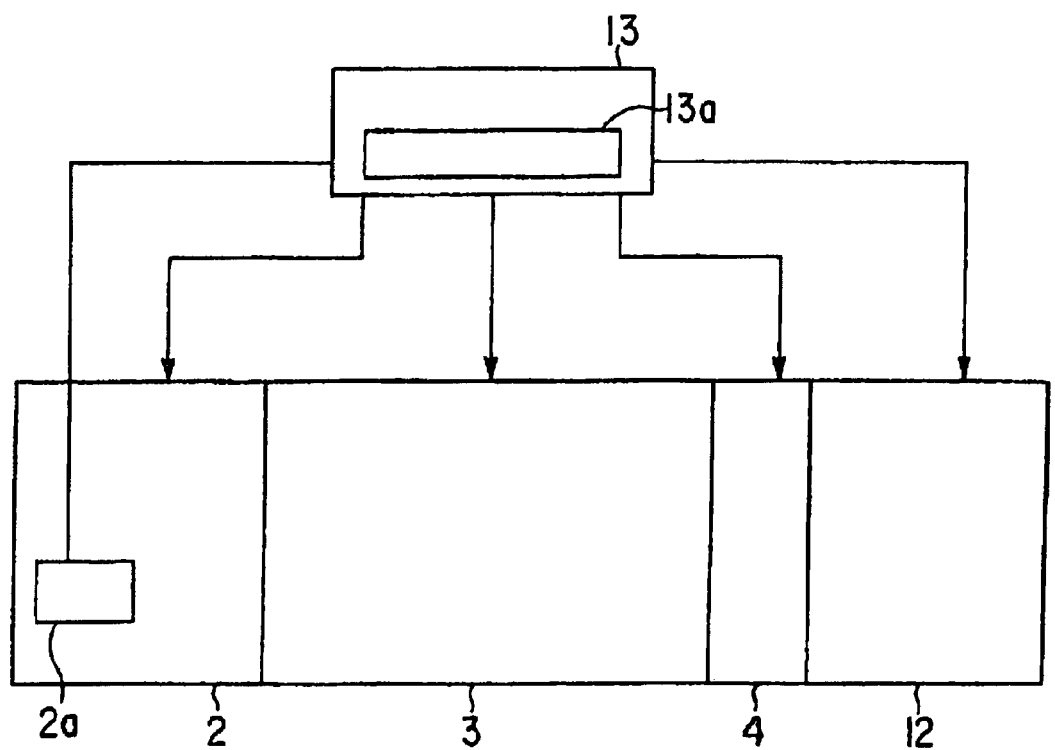
FIG. 5 shows a control block diagram of the substrate processing system.

FIG. 5 shows a control block diagram of the substrate processing system 1. The loading/unloading section 2 has a main panel 2a, on the outer wall at the front side, for total-system control and operations such as recipe settings, wafer-flow registration and alarm processing. The main panel 2a is a touch-censer type via which an operator touches a screen with a touch pen for system operation.

The main panel 2a is connected to a controller 13 so that data on recipe, etc., entered via the touch panel 2a are fed to the controller 13. Based on the data, the controller 13 sends several types of commands to and controls the first and the second transfer mechanisms 6 and 7, the loading/unloading section 2, the processing section 3, the interface section 4 and exposing apparatus 12. The controller 13 is shown outside the system 1 in FIG. 5. It will, however, be installed, for instance, in the loading/unloading section 2 in actual use.

Monitor display changes when an operator touches the main panel 2a at particular display sections for detailed process settings for the processing units such as temperature, net processing time and rotation speed for resist applying apparatus.

Disclosed next is a substrate-processing procedure for the substrate processing system 1 described above with reference to FIG. 6.

Performed first before substrate processing are recipe settings via the main panel 2a provided on the front side of the substrate processing system 1 shown in FIGS. 1 to 3.

A transfer recipe is set first in the recipe settings. The transfer recipe includes contents of processing to be performed such as adhesion, development and exposure and their order. The number of wafers W to be processed may also be set in the recipe settings. The recipe settings are performed by touching the main panel 2a provided on the loading/unloading section 2 with a touch pen.

In detail, steps and processing units such as shown in FIG. 7 are designated in the recipe settings. An actual unit name may not be designated as data to be entered when a plurality of identical processing units are provided for one type of processing. Detailed processing requirements for each unit such as temperature and processing time (processing recipe) may be pre-stored in a memory 13a of the controller 13. Moreover, an operator can set further detailed requirements for step or unit designation.

Once the transfer recipe is entered in accordance with the above procedure, a recipe flow, etc., is displayed on the main panel 2a. On correct recipe settings via the main panel 2a, the controller 13 automatically calculates the maximum processing time Tmax that defines one processing cycle for each unit in a system-steady state.

Disclosed first is substrate processing in a transitional state in which a process performed by one unit does not affect a process performed by another unit.

Several wafers W are charged in each of the cassettes CR. The cassettes CR are set on the table 5 of the loading/unloading section 2 shown in FIGS. 1 to 3. After positioning of the cassettes CR, the wafers W are taken out by the sub-arm mechanism 6 and transferred into the loading/unloading section 2 one by one (step S1). Each of the transferred wafers W is transferred in the X-direction and transferred further into the processing section 3.

This wafer W is fed to the alignment unit ALIM of the processing section 3. After positioning for the wafer W by the unit ALIM, it is transferred to the adhesion unit AD via the main-arm mechanism 7.

A period of time from a moment at which the wafer W remains in the alignment unit ALIM to another moment at which it is fed to the adhesion unit AD is called a time t1.

Figure 9:
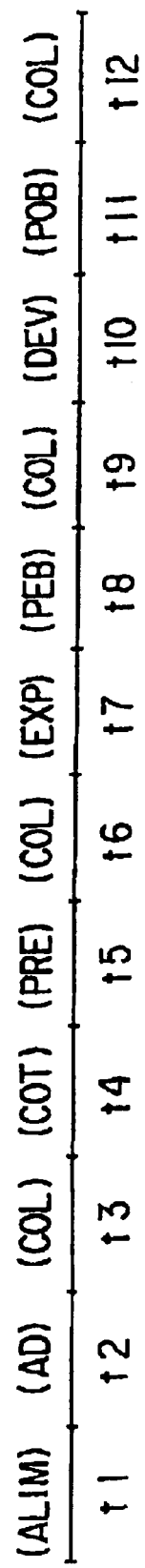
FIG. 9 is a timing chart for substrate processing in a transitional state.

A timing chart for substrate processing in this transitional state is shown in FIG. 9. The extension unit EXT may be used instead of the alignment unit ALIM as the unit that firstly accepts the wafer W that has been transferred into the processing section 3.

The wafer W is subjected to hydrophobic processing in the adhesion unit AD (step S2). A period of time consumed by the unit AD for the hydrophobic processing is called a time t2.

The wafer W is taken out from the adhesion unit AD and fed to the cooling unit COL for cooling processing (step S3). A period of time consumed for the hydrophobic processing is called a time t3. The cooling processing can be performed by any one of the four identical cooling units COL1 to COL 4 (FIG. 4). This is the same for any processing described later. In other words, any of the identical processing units can perform a necessary processing when a plurality of identical units are installed. It is preferable to choose a processing unit from among the identical units to which a wafer W is transferred by the main-arm mechanism 7 for the shortest time.

Next, the wafer W is positioned so that it faces the resist-applying apparatus COT1 of the first processing-unit group G1 or the identical apparatus COT2 of the second group G2 (FIG. 4) and transferred thereinto by the main-arm mechanism 7. A resist is applied onto the wafer W while rotated for a processing time t4 (step S4).

The resist-applied wafer W is fed into the pre-baking unit PREBAKE so that it is dried out with evaporation of a solvent (thinner) from the resist (step S5). A period of time consumed for the pre-baking is called a time t5.

The wafer W taken out from the pre-baking unit PREBAKE is cooled by the cooling unit COL for a processing time t6 (step S6), and then transferred to a second sub-arm mechanism 9 of the interface section 4 via the extension unit EXT.

The wafers W transferred to the second sub-arm mechanism 9 are charged in a buffer cassette BUCR (FIG. 1) one by one. The interface section 4 transfers each wafer W to the exposing apparatus 12 and receives the wafer W that has been subjected to exposure (step S7). The exposed wafer W is further subjected to exposure by a peripheral exposing apparatus WEE for exposing unnecessary resist applied on peripheral portions of the wafer W.

The further exposed wafer W is returned to the main-arm mechanism 7 in the manner reversal of the operation described above. The main-arm mechanism 7 transfers the wafer W into the post-exposure baking unit PREBAKE. A period of time from a moment at which the wafer W is taken out from the cooling unit COL to another moment at which it is fed into the post-exposure baking unit PREBAKE via exposing processing is called a time t7.

The wafer W is heated in the post-exposure baking unit PREBAKE for a processing time t8 (step S8) and then fed to the cooling unit COL, so that it is cooled to a predetermined temperature for a processing time t9 (step S9).

The cooled wafer W is fed into the resist-developing apparatus DEV of the first processing-unit group G1 or the second group G2 and developed for a processing time t10 (step S10).

The developed wafer W is fed to the post-baking unit POBAKE and heated so that it is dried out for a processing time t11 (step S11). The wafer W is further transferred to the cooling unit COL4 so that it is cooled for a processing time t12 (step S12) by the main-arm mechanism 7. The cooled wafer W is transferred to the loading/unloading section 2 via the extension unit EXT of the third processing-unit group G3 and charged in the cassette CR (step S13).

A pre-transfer time, a net processing time and a post-transfer time are deified in this transitional state as follows:

The pre-transfer time is a period from a moment at which a wafer W has been transferred to a unit for a certain processing to another moment at which the processing starts for the wafer W (a period from a moment at which a wafer W is taken out from a previous unit to another moment at which the present unit starts processing).

The net processing time is a period consumed by any unit for processing a wafer W.

The post-transfer time is a period for which a processed wafer W is transferred again to the main-arm mechanism 7.

The net processing time is set as constant but depends on several requirements such as resist types. A waiting time added to each of the pre- and post-transfer time offers highly flexible processing. This transitional state, however, requires no waiting time because of no unnecessary waiting-time consumption for the present wafer W to be processed against the previous wafer W under processing. Each of the processing time t1 to t13 is determined in accordance with a given net processing time and the minimum transfer time.

A transfer time required for the main-arm mechanism 7 in this embodiment is about 5 sec. The post-transfer time is required for the main-arm mechanism 7 to take out a wafer W, and hence the shorter the post-waiting time that follows the post-transfer time, the better for stable process requirements (0 sec., being impossible though).

Transfer of wafers W from the cassettes CR one by one for respective processing in the transitional state will cause unnecessary waiting-time consumption for processing of a next wafer W against processing of the previous wafer W due to the fact that the previous wafer W delivered from a cassette CR is still under processing in a unit against the next wafer W that is to be fed into this unit.

The system 1 in this embodiment starts the maximum processing-time control when such unnecessary waiting-time consumption occurs.

For the time control, each processing unit is equipped with a sensor (not shown) for determining whether a wafer W is under processing. Each sensor is connected to the controller 13 to determine whether the unnecessary waiting-time consumption discussed above is occurring based on a detection signal from each sensor. When it is determined that the unnecessary waiting-time consumption is occurring, substrate-processing in the transitional state is halted and the processing in the steady state starts instead.

The steady state in this invention is a state that several wafers W have already been fed in the processing section 3 and the unnecessary waiting-time consumption discussed above is occurring over succeeding processing units.

The maximum processing-time control disclosed below is performed in this steady state.

In this control, each processing unit performs processing for the maximum processing time Tmax, as one cycle, calculated by the controller 13 in recipe settings. The maximum processing time Tmax is defined as the maximum period among periods tn/m consumed by each unit obtained by dividing a processing time "tn" for each unit by the number of the identical units "m". A period consumed by a processing unit equals to addition of the pre-transfer time, the net processing time and the post-transfer time.

Suppose that the developing apparatus DEV requires the longest processing time. When addition of the pre-transfer time, the net processing time and the post-transfer time gives a time tDEV, the maximum processing time Tmax is given as tDEV/2 because the system 1 in this embodiment has two identical developing apparatus DEV.

The longest processing time per unit is defined as the maximum processing time Tmax, and hence Tmax is given as tEXP/1 from tEXP/1>tDEV/2 when only one exposing apparatus EXP is installed and addition of the pre-transfer time, the net time and the post-transfer time gives a time tEXP.

Each unit performs processing for the maximum processing time Tmax as obtained above as one cycle. Therefore, the requirement (pre-transfer time)+(net processing time)+(post-transfer time)<Tmax (1 cycle) is given to the processing units other than those requiring the maximum period consumed per unit. These units thus perform processing for (pre-transfer time)+(net processing time)+(post-transfer time)+(waiting time). One cycle may be determined as (maximum processing time)+(surplus time).

Figure 10:
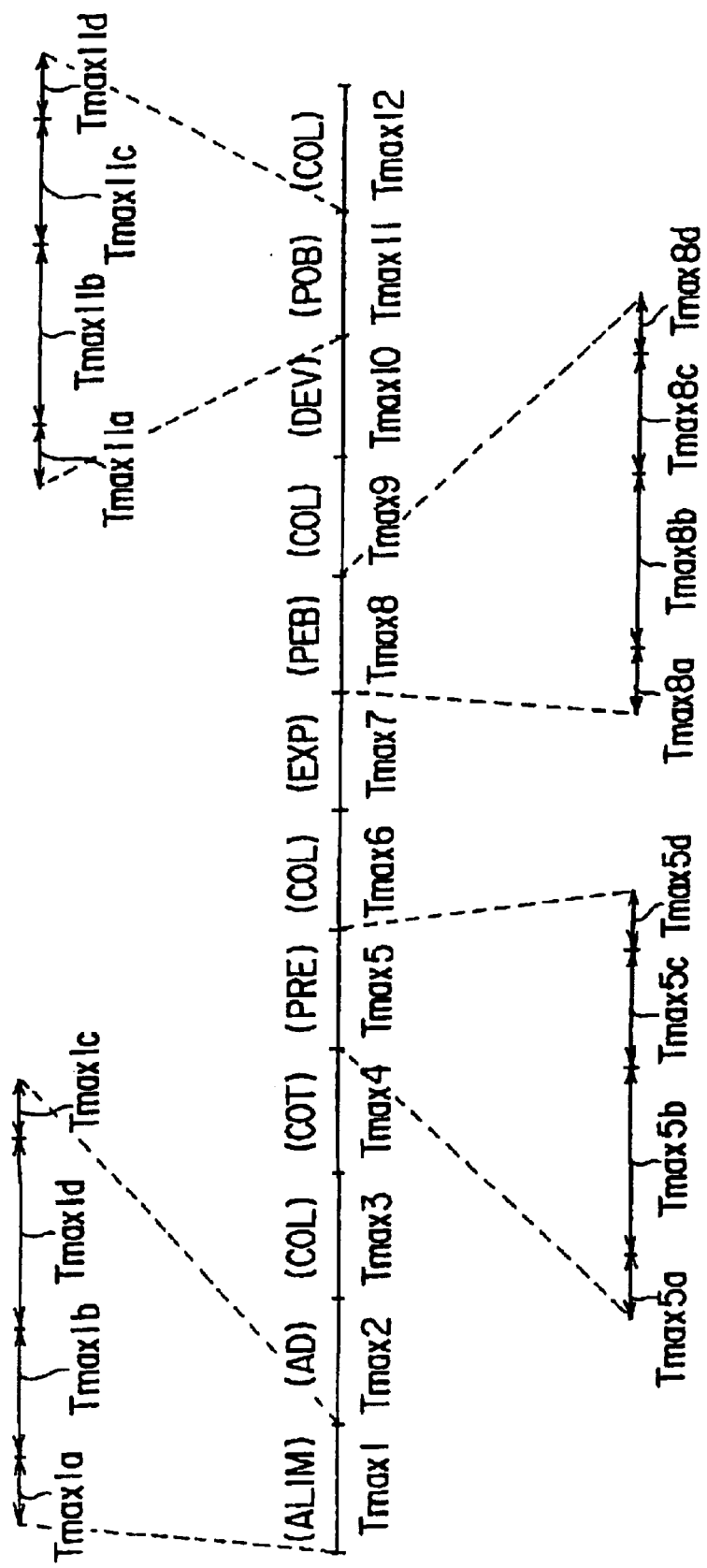
FIG. 10 is a timing chart for substrate processing in a steady state.

The following is disclosed with Tmax1, Tmax2, . . . , and Tmax12 (=Tmax) as one cycle for each unit for processing a wafer W that has been firstly transferred to the processing section 3, with reference to a timing chart shown in FIG. 10 in the steady state.

For the maximum processing time Tmax1 as the first cycle, the wafer W that has been firstly transferred to the processing section 3 is fed to the alignment unit ALIM of the third processing-unit group G3 for wafer positioning (step S1). Before this wafer W, in this steady state, several wafers W have already been under processing in respective units of the processing section 3.

For the maximum processing time Tmax1, Tmax1$a$ is defined as a pre-transfer time required for completion of wafer transfer to the alignment unit ALIM, Tmax1$b$a net processing time for wafer alignment, and Tmax1$c$a post-transfer time required for completion of wafer transfer from the alignment unit ALIM.

These time definition give Tmax1$a$+Tmax1$b$+Tmax1$c$<Tmax, which requires a waiting time within one cycle. In this embodiment, therefore, post-transfer is performed for the wafer W after waiting for a post-waiting time Tmax1$d$ in the alignment unit ALIM, that follows the net processing time Tax1$b$.

The same post-waiting time as for the alignment unit ALIM is set for all the processing units described below other than those requiring the maximum period consumed per unit.

The wafer W positioned as above is transferred to the adhesion unit AD by the main-arm mechanism 7, for hydrophobic processing (step S2). A period of time from a moment at which the wafer W is transferred to the adhesion unit AD for hydrophobic processing to another moment at which the wafer W is taken out from the adhesion unit AD is the maximum processing time Tmax2. During the time Tmax2, the next wafer W is transferred to the alignment unit ALIM for positioning (step S1).

Processing cycles are preferably set with a certain interval between each of successive wafers W. For example, a one-cycle starting time for a wafer W to be transferred to the processing section 3 is delayed by about 5 sec., from a one-cycle starting time for the previous wafer W.

Such interval for transfer time set for the main-arm mechanism 7 among the processing units avoids interference which may otherwise occur in transfer of several wafers W by the main-arm mechanism 7 to the processing units. For example, in this embodiment, a wafer W is transferred from the adhesion unit AD to the cooling unit COL by the main-arm mechanism 7 for 5 sec., and after that, the next wafer W is transferred from the alignment unit ALIM to the adhesion unit AD for 5 sec.

The wafer W for which hydrophobic processing has been completed for the time Tmax2 is subjected to cooling processing in the cooling unit COL (step S3) for the time Tmax3. The cooling processing can be performed by any unit among the four identical cooling units COL1 to COL4. The cooling unit must, however, be selected from among the units COL1 to COL4 so that a wafer W will not interfere with the previous wafer W that is under the processing in the selected unit.

The unit selection from among identical processing units is performed by the controller 13 based on a signal output by a sensor (not shown) attached to each unit. This sensor determines whether each identical unit is performing processing or wafer transferring, or there is a wafer W in it or not. The sensor output may be displayed on the main panel 2$a$.

Also in the following processing, any unit among the identical units for the same processing is selected so that a wafer W will not interfere with the previous wafer W that is under the processing in the selected unit.

During the time Tmax3, a wafer W (one-wafer behind) that has been transferred to the processing section 3 just after the wafer W now under the cooling processing is subjected to hydrophobic processing in the adhesion unit AD (step S2), and another wafer W (two-wafer behind) just after the wafer W now under the hydrophobic processing is transferred to the alignment unit ALIM and subjected to positioning.

The wafer W for which the cooling processing has been completed is transferred to the resist-applying apparatus COT in which a resist is applied onto the wafer W while being rotated for the processing time Tmax4 (step S4). During the time Tmax4, a wafer W (one-wafer behind) that has transferred to the processing section 3 is subjected to cooling processing in the cooling unit COL, another transferred wafer W (two-wafer behind) is subjected to hydrophobic processing in the adhesion unit AD (step S2), and still another transferred wafer W (three-wafer behind) is subjected to positioning in the alignment unit ALIM (step S1).

Also within the succeeding processing times Tmax5 to Tmax11, wafers W are subjected to respective processing one by one in the corresponding units, which is not disclosed though.

The wafer W on which resist has been applied within the processing time Tmax4 is transferred to the pre-baking unit PREBAKE at the start of the next processing time Tmax5.

FIGS. 8A and 8B show vertical sections of an example of the pre-baking unit PREBAKE or other thermal processing units.

A thermal processing unit 101 has a block 102 opened upwards. Installed in the block 102 is a hot plate 103 on which a wafer W is placed and heated. The hot plate 103 is provided with several (for example, three) lift pins 104 for supporting the wafer W during wafer transfer into and from the thermal processing unit 101. The lower ends of the lift pins 104 are connected to an elevation drive mechanism (not shown) via a pin-supporting member 105 so that they can be elevated through the hot plate 103.

An upper cover 106 is provided over the hot plate 103 with a space S therebetween for wafer transfer. An exhaust pipe 107 is connected to the upper cover 106, for exhausting gas that will be generated during thermal processing.

Installed further in the block 102 is a cylinder shutter 108 that covers the space S and the hot plate 103. The shutter 108 is also elevated by an elevation drive mechanism (not shown).

A wafer W is taken into the thermal processing unit 101 while it is lifted up from the hot plate 103 by the lift pins 101 during which the shutter 108 is elevated so that the space S is closed. The wafer W remains an up-lifted position while waiting for the pre-baking processing.

In thermal processing by the pre-baking unit PREBAKE, the wafer W is taken into the unit for a pre-transfer (before processing) time Tmax5$a$ and waits for a pre-waiting (before processing) time Tmax5$b$ while it is lifted up.

Then, as shown in FIG. 8B, the wafer W is lifted down on the hot plate 103 while the lift pins 104 are moved down, for pre-baking for a net processing time Tmax5$c$ (step S5) and taken out from the pre-baking unit PREBAKE for a post-transfer (after processing) time Tmax5$d$.

The total of the pre-transfer time, the pre-waiting time, the net processing time and the post-transfer time equals to the processing time Tmax5(=Tmax5$a$+Tmax5$b$+Tmax5$c$+Tmax5$d$).

The wafer W is then subjected to cooling processing in the cooling unit COL for a processing time Tmax6 (step S6) and then transferred into the exposing unit EXP for exposure to a given pattern for a processing time Tmax7 (step S7), with peripheral exposure by the peripheral exposing apparatus WEE.

The wafer W for which the exposing processing has been completed is transferred to the post-exposure baking unit PEBAKE within a pre-transfer time Tmax8$a$ while it is lifted up from the hot plate 103 by the lift pins 101, as shown in FIG. 8A.

After being lifted up for a pre-waiting time Tmax8$b$, the wafer W is lifted down on the hot plate 103 while the lift pins 104 are moved down, for post-exposure baking PREBAKE for a net processing time Tmax8$c$ (step S8). The wafer W is then taken out from the post-exposure baking unit PREBAKE within Tmax8$d$.

The total of the pre-transfer time, the pre-waiting time, the net processing time and the post-transfer time equals to the processing time Tmax8(=Tmax8$a$+Tmax8$b$+Tmax8$c$+Tmax8$d$).

The wafer W for which the thermal processing has been completed is transferred to the cooling unit COL for cooling processing for a processing time Tmax9 (step S9). Then, the wafer W is taken out from the cooling unit COL and transferred to the resist-developing apparatus DEV for developing processing for a processing time Tmax10 (step S10). The wafer W is further transferred to the post-baking unit POBAKE for thermal and dry processing by a given cycle time Tmax11. Like the other thermal processing units, a pre-waiting time Tmax11$b$ is set for the post-baking unit POBAKE.

The wafer W is then transferred to the cooling unit COL by the main-arm mechanism 7, for cooling processing for a processing time Tmax12 (step S12), and returned to the cassette CR (step S13).

As disclosed, a wafer W is taken into and out from the processing section 3 for a period from Tmax1 to Tmax12 in the steady state.

Accordingly, the present invention performs wafer processing in the steady state so that each unit performs respective processing for the maximum processing time Tmax decided in accordance with the wafer-processing recipe with a pre-waiting time set at the start of the maximum processing time in each thermal processing while each wafer W is lifted up, thus drastically decreasing thermal effects.

Second Embodiment

This embodiment relates to pre-waiting time settings to two processing units against one unit by which unnecessary waiting-time consumption occurs. The processing in the transitional state is the same as that for the first embodiment and hence not disclosed here.

The substrate processing system in this embodiment is identical to the one for the first embodiment shown in FIGS. 1 to 3. The flowchart shown in FIG. 6 for the first embodiment is also used in this embodiment.

Figure 11:
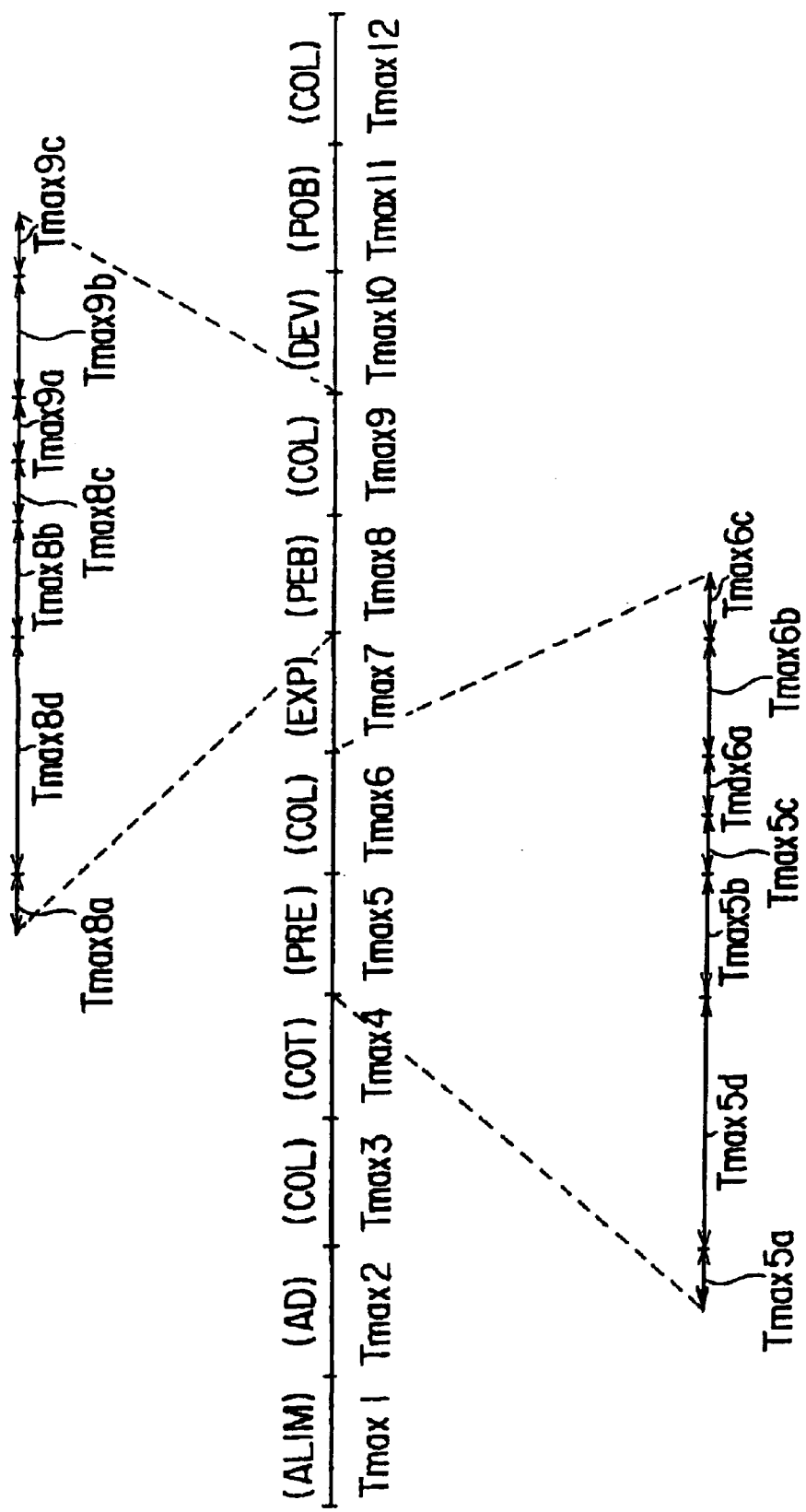
FIG. 11 is a timing chart for a second embodiment of a substrate processing system according to the present invention in a steady state.

The difference between the first and the second embodiments is waiting timing for each processing. FIG. 11 is a timing chart for the substrate-processing timing in this embodiment. The timing chart shown in FIG. 9 for the first embodiment includes pre-waiting time adjustment within one maximum processing time for one processing unit by which unnecessary waiting-time consumption occurs. On the other hand, this embodiment includes pre-waiting time adjustment within a processing time over two processing units against one unit by which unnecessary waiting-time consumption occurs.

Disclosed below is pre-waiting time setting before development processing DEV.

The maximum processing time Tmax is calculated like the first embodiment. Each unit performs processing per maximum processing time in the first embodiment. Like the first embodiment, the second embodiment could suffer from unnecessary waiting-time consumption for processing followed by long processing for each unit. Such unnecessary waiting-time consumption will cause change in pattern width, etc. In order to solve such a problem, the second embodiment adjusts the maximum processing time corresponding to a two-cycle time so that a net processing time Tmax$b$ for each thermal processing requires the least waiting time before a net processing time for development.

The maximum processing time Tmax8 given to the post-exposure baking PREBAKING consists of a pre-transfer time Tmax8$a$, a net processing time Tmax8$b$, a post-transfer time Tmax8$c$ and a waiting time Tmax8$d$.

The maximum processing time Tmax9 given to the cooling unit COL consists of a pre-transfer time Tmax9$a$, a net processing time Tmax9$b$, a post-transfer time Tmax9$c$ and a waiting time Tmax9$d$. The pre-transfer time Tmax$a$ and the post-transfer time Tmax$b$ require a certain least period.

Therefore, in this embodiment, the waiting time Tmax8$d$ for the post-exposure baking unit PREBAKING is set before the net processing and the waiting time Tmax9$d$ for the cooling unit COL is set at zero. The settings offer the least waiting time after the net post-exposure baking processing PREBAKING but before the net development processing.

Accordingly, wafers W can be transferred to the development processing for the minimum time in this embodiment while the least transfer time is required though. This embodiment thus advantageous than the first embodiment in which development processing is performed after the elapse of waiting time occurred at the cooling unit COL due to allocation of one-cycle time to each processing unit.

A waiting time for each of the pre-baking PREBAKE and the cooling COL before exposure EXP is also adjusted in the same way as disclosed above.

As disclosed, this embodiment achieves short waiting time after thermal processing, compared to that in the first embodiment, thus providing a substrate-processing system that hardly suffers from thermal effects.

Disclosed in this embodiment is the waiting-time adjustment for two processing units before development DEV or pre-baking PREBAKE. However, if the adjustment for two processing units cannot produce the least waiting time, it is also possible to make waiting-time adjustment within 3× or 4× one-cycle time to shorten the waiting time after thermal processing.

A waiting-time adjustment is, for example, required for three processing units before development when Tmax8a−min+Tmax8c−min+Tmax9a−min+Tmax9c−min<Tmax10b.

Accordingly, this embodiment achieves flexible waiting-time adjustments in accordance with the ratio of net processing time Tmaxb to maximum processing time.

Third Embodiment

This embodiment relates to allocation of processing time to two processing units within a one-cycle time. The processing in the transitional state and the system structure in this embodiment are identical to those for the first embodiment and hence not disclosed here.

The substrate processing system in this embodiment is identical to the one for the first embodiment shown in FIGS. 1 to 3. The flowchart shown in FIG. 6 for the first embodiment is also used in this embodiment.

Figure 12:
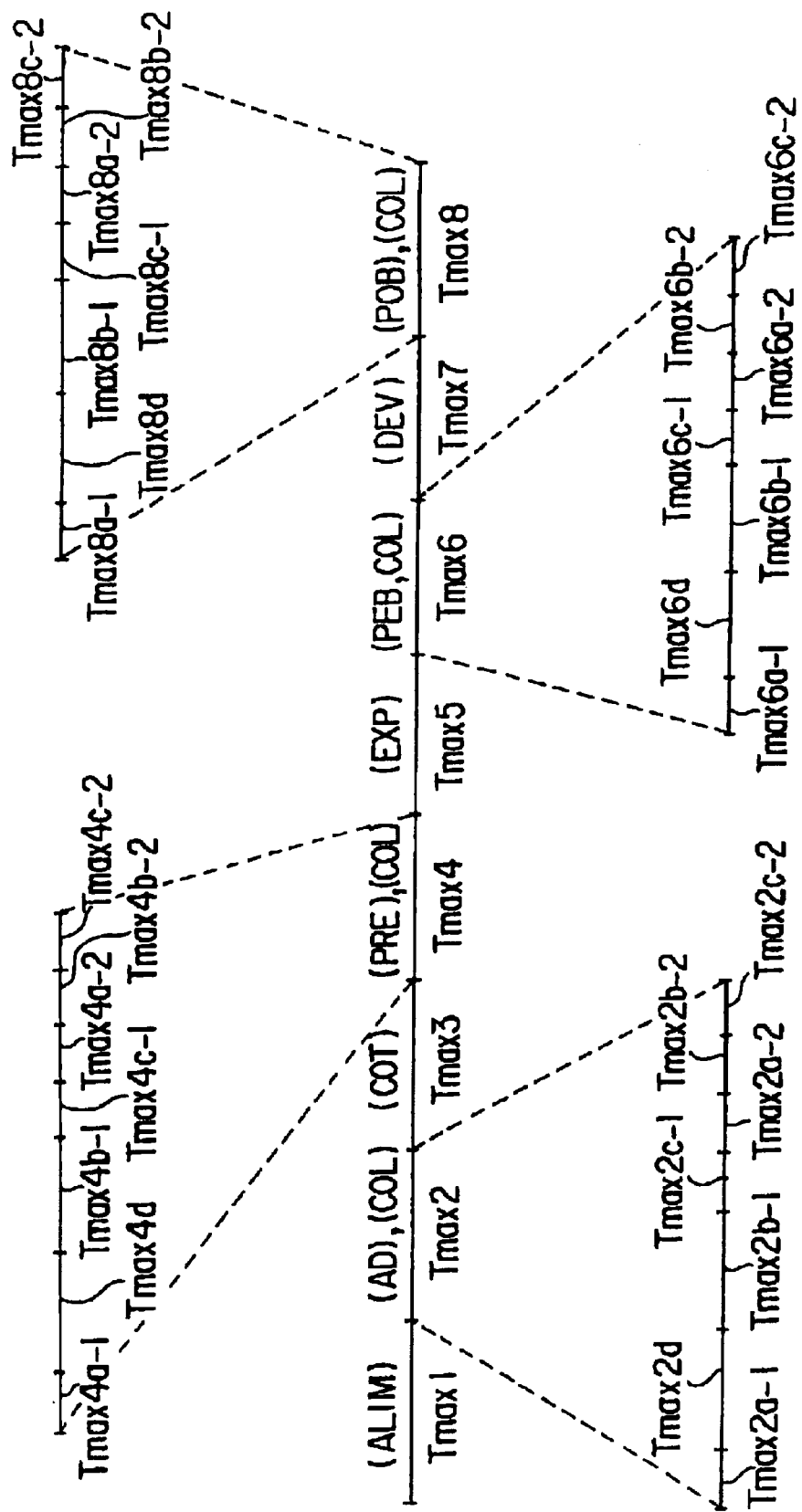
FIG. 12 is a timing chart for a third embodiment of a substrate processing system according to the present invention in a steady state.

The difference between the first and the third embodiments lies in the timing chart for each processing. FIG. 12 is a timing chart for the substrate-processing in this embodiment.

In this embodiment, the processing in an adhesion unit AD and a cooling unit COL is performed for the maximum processing time Tmax2a (one-cycle time).

Likewise, a one-cycle time is given to a pre-baking unit PREBAKE and a cooling unit COL, a post-exposure baking unit POBAKE and a cooling unit COL, and post-exposure baking unit POBAKE and a cooling unit COL.

A processing time for the cooling unit is relatively short in this substrate-processing system. It is thus expected that the addition of a processing time for thermal processing and that for cooling processing is shorter than that for exposing processing per exposing apparatus EXP or developing processing per developing apparatus DEV. Allocation of a one-cycle time to each of the thermal processing unit and the cooling unit in this case will result in a long waiting time compared to a net processing time.

Accordingly, a one-cycle time is given to these two processing units in this embodiment for avoiding such improper settings.

For example, for the pre-baking unit PREBAKE and the cooling unit COL, a one-cycle time is set in the order of a pre-transfer time Tmax6a-1 to the pre-baking unit PREBAKE, a pre-waiting time Tmax6d, a net processing time Tmax6b-1 for pre-baking, a post-transfer time Tmax6c-1 from the pre-baking unit PREBAKE, a pre-transfer time Tmax6a-2 to the cooling unit COL, a net processing time Tmax6b-2 for cooling, a post-transfer time Tmax6c-2 from the cooling unit COL.

Waiting time Tmax2d, Tmax4d and Tmax8d are also set for other processing units in the same way.

Allocation of a one-cycle time to two processing units as disclosed decreases the total number of cycles for enhanced throughput.

This cycle allocation can be applied even if a processing time for two units is longer than the maximum processing time for each of other units, with setting the processing time for the two units as the maximum processing time. Moreover, a one-cycle time may be allocated to three or more processing units.

Fourth Embodiment

The first embodiment includes the cycle-time settings based on a period for a wafer W to remain in each processing unit.

In this embodiment, on the other hand, includes cycle-time settings for a temporal cycle time (called wafer remaining-induced unnecessary waiting-time-consumption cycle time hereinafter) that is set based on a period for a wafer W to remain in each processing unit or another temporal cycle time (called transfer-induced unnecessary waiting-time-consumption cycle time hereinafter) that is set based on a period for a wafer W to be transferred by an arm.

The system structure in this embodiment is identical to that for the first embodiment and hence not disclosed here.

Calculation of the transfer-induced unnecessary waiting-time-consumption cycle time (transfer-induced rate controlling cycle time) is disclosed.

Parameters required for calculation of the transfer-induced unnecessary waiting-time-consumption cycle time are set as follows:

Set at first is a one-cycle time (called a time "cra" hereinafter) for the first sub-arm mechanism 6 from a moment at which it takes out a wafer W from a cassette CR in the loading/unloading section 2, via transferring the wafer W to a processing unit of the processing section 3, that firstly receives the wafer W, such as, the alignment unit ALIM or the extension unit EXT, to another moment at which it takes out the next wafer W. The time "cra" is set, for example, at 20 sec., for the same type of substrate-processing system, however, depends on system types.

Set secondary is a main-arm cycle-round time (called a time "pra" hereinafter) that is the total of periods required for the main-arm 8 to transfer a wafer W from a processing unit to another unit for one cycle in the processing section 3. A period required for the main-arm 8 to transfer a wafer W from a one unit to another for one cycle depends on each unit. The time "pra" thus equals to a period required per unit for the main-arm 8 for one cycle.

Set thirdly is a period in one cycle (called a time "ira" hereinafter) required for wafer transfer between the processing section 3 and the exposing apparatus 12. The time "ira" is obtained by multiplying a transfer time "ts" by the number of steps "p". The transfer time "ts" is obtained per wafer W by adding a period for which a wafer W is transferred from the processing section 3 to the exposing apparatus 12 and another period for which the wafer W is taken out from the exposing apparatus 12. The number "p" is the number of steps for wafer transfer and receiving within one cycle. The time "ira" is obtained, for example, as 7.5 sec×p when the transfer time "ts" is 7.5 sec.

The maximum time among the three parameters time "cra", time "pra" and time "ira" calculated as above is set as the transfer-induced unnecessary waiting-time-consumption cycle time.

Calculation of the wafer remaining-induced unnecessary waiting-time-consumption cycle time (wafer remaining-induced rate controlling cycle time) is not disclosed here because it is understood from the first to the third embodiments.

Either the wafer remaining-induced unnecessary waiting-time-consumption cycle time or the transfer-induced unnecessary waiting-time-consumption cycle time, larger than the other, is set as the temporal cycle time.

It is determined next as disclosed below whether the temporal cycle time can be used as a legitimate cycle time. In this embodiment, any cycle time other than the legitimate cycle time is a provisional cycle time for decision of cycle time. Several types of processing are sequentially performed per legitimate cycle time.

Calculated first is a period (called an ira-transfer time hereinafter) for which a wafer W is transferred to a processing unit (called a starter unit hereinafter) that performs processing just before the wafer W is transferred to the exposing apparatus 12.

The starter unit is a CPL unit that is capable of wafer transfer to the exposing apparatus 12 and also wafer processing such as cooling.

The ira-transfer time is the total of arm wafer—transferring periods among the processing units until wafer transfer to the exposing apparatus 12 is completed in one cycle. For processing units capable of simultaneous wafer transfer and reception, it is preferable to add values each obtained by dividing a transfer time by 2 because a transfer time required for such unit is just a half of the transfer time.

Calculated next is a period (called an ira-processing time) required for processing in the starter unit. The temporal cycle time is subtracted from the ira-transfer time and the ira-processing time to obtain an ira-delay time as follows:

(ira-delay time)={(ira-transfer time)+(ira-processing time)}−(temporal cycle time)

The ira-delay time indicates a period for which the starter unit performs processing beyond the temporal cycle time. Without cycle-time settings so that no ira-delay time is produced, unnecessary waiting-time consumption will occur due to processing in the starter unit even though the other units in the processing section 3 perform processing within the cycle time.

In order to avoid such occurrence of unnecessary waiting-time consumption, it is determined whether the addition of the time "ira" and the ira-delay time is longer than the temporal cycle time. The addition longer than the temporal cycle time will cause unnecessary waiting-time consumption due to processing in the starter unit to the other units.

It is thus determined that processing in the starter unit will cause unnecessary waiting-time consumption to all processing in processing units including the units in the processing section 3 when (time "ira")+(ira-delay time)>(temporal cycle time). And then (time "ira")+(ira-delay time) is decided as the legitimate cycle time.

On the other hand, when (time "ira")+(ira-delay time)<(temporal cycle time), it is determined that processing in the starter unit will not cause unnecessary waiting-time consumption to the other processing units. The temporal cycle time is thus decided as the legitimate cycle time.

As disclosed, this embodiment achieves flexible cycle-time settings under consideration of unnecessary waiting-time consumption due to processing in each unit and also to transfer processing.

This embodiment uses a processing unit as the starter unit, from which a wafer W is transferred to the exposing apparatus 12.

Not only that, however, any other units such as the extension unit EXT of the processing section 3 can be used as the starter unit for decision of cycle time in the same way as described above.

For example, the time "ira", the ira-delay time and the ira-processing time are calculated for decision of cycle time in the same way as described above with the extension units EXT as the starter units, that are installed in the third to the fifth processing-unit groups G3 to G5 of the processing section 3 and when the extension units EXT are capable of processing such as cooling and also wafer transfer-in and -out.

The legitimate cycle time disclosed above is calculated for example by the controller 13. Then, based on the legitimate cycle time, the controller 13 calculates the pre-transfer time, the post-transfer time, and so on, for the processing units of the loading/unloading section 2, the processing section 3, the interface section 4 and the exposing section 12.

The pre-transfer time and the post-transfer time can be calculated like the first embodiment such as shown in FIG. 10. The pre- and the post-transfer times calculated per processing unit are stored in a database (not shown) and sent to a control mechanism (not shown) connected to the units. The control mechanism drives the processing units at the timing decided in accordance with the pre- and the post-transfer times.

The present invention is not limited to the embodiments disclosed above. In other words, the substrate-processing system according to the present invention can be applied to any processing units other than the substrate-processing units described above.

Various types of processing units can be installed in each processing-unit group. The number of processing units is also flexible.

The present invention is applied to the substrate processing system used for photolithography in the foregoing embodiments. This invention is, however, also applicable to a processing system such as shown in FIG. 13.

Elements in the system shown in FIG. 13 that are the same as or analogous to elements in the system shown in FIG. 1 are referenced by the same reference numbers and will not be explained in detail.

The processing system shown in FIG. 13 has the loading/unloading section 2 and the processing section 3, without the interface section 4 and the exposing apparatus 12. Moreover, the processing units installed in the first and the second processing-unit groups G1 and G2 of the processing section 3 are any processing solution-used units other than the resist-applying units COT and the resist-developing units DEV.

It is further understood by those skilled in the art that various change and modification may be made in the invention without departing from the spirit and scope thereof.

Moreover, the foregoing embodiments are disclosed on pre-waiting (before processing) while a wafer W is lifted up in each thermal processing unit. Not only, that, however, the present invention can be applied to pre-waiting in which a wafer W is once remained in an empty unit such as an extension unit EXT before it is transferred a thermal processing unit.

As disclosed above, according to the present invention, one cycle is set based on the longest processing time among processing units and also a pre-waiting time is set within the set one cycle, thus drastically decreasing unnecessary waiting-time consumption discussed above.

What is claimed is:

1. A substrate processing system for processing substrates, comprising:

first to n-th processing unit groups, n being a positive integer, each unit group having at least one processing unit and being configured to perform first to n-th substrate processing for given periods t1 to tn, respectively;

a loading/unloading section section;

a first transfer section configured to receive/transfer the substrates from/to the loading/unloading section and to transfer the substrates one by one to one of the processing unit groups; and a controller configured to control the first transfer section and the processing units such that each processing unit processes a substrate in a respective process time that is less than or equal to a standard one-cycle time, the one-cycle time being a maximum period among periods t1/m to tn/m, m being a positive integer equal to the processing units actually present in each of the first to n-th processing unit groups, respectively, wherein the processing time of each processing unit includes a pre-transfer time, a net processing time, a post-transfer time, and a waiting time, and the controller adjusts the processing time of each processing unit in accordance with the one-cycle time.

2. The substrate processing system according to claim 1, wherein the waiting time is added to the pre-transfer time or the post-transfer time.

3. The substrate processing system according to claim 1, wherein the processing units include at least one thermal processing unit.

4. The substrate processing system according to claim 3, wherein the at least one thermal processing unit includes a heating mechanism and a lift-up mechanism configured to distance each substrate from the heating mechanism during the waiting time of the thermal processing unit.

5. The substrate processing system according claim 1, wherein the processing units include one developing unit configured to develop a resist applied onto each substrate.

6. The substrate processing system according to claim 1, wherein the processing units include at least one exposing apparatus configured to expose a resist applied onto each substrate.

7. The substrate processing system according to claim 1, further comprising:

a second transfer section accessible to each of the processing units and configured to transfer each substrate from one of the processing units to another.

8. A substrate processing system for processing substrates, comprising:

first to n-th processing unit groups, n being a positive integer, each unit group having at least one processing unit and being configured to perform first to n-th wafer processing for given periods t1 to tn, respectively;

a loading/unloading section;

a first transfer section configured to receive/transfer the substrates from/to the loading/unloading section and to transfer the substrates one by one to one of the processing unit groups;

a second transfer section configured to receive/transfer the substrates from/to the processing units; and a controller configured to control the first transfer section, the second transfer section, and the processing units such that each processing unit processes a substrate within a one-cycle time set as the greater of a first transfer time or a second transfer time, the first transfer time being of a duration required for the first transfer section to remove the substrate from the loading/unloading section, transfer the substrate to the one of the processing unit groups, and remove a next substrate from the loading/unloading section, and the second transfer time being a duration for which the second transfer section moves a substrate from one processing unit group to a next processing unit group.

9. The substrate processing system according to claim 8, wherein the controller calculates the maximum period among periods t1/m to tn/m, m being a positive integer equal to the processing units actually present in each of the first to n-th processing unit groups, respectively, and the controller sets the maximum period as the first transfer time or the second transfer time.

10. The substrate processing system according to claim 8, wherein at least one of the processing units is a substrate-receiving unit configured to receive and process each substrate, and the controller calculates a processing time for the substrate-receiving unit and sets the processing time of the substrate-receiving unit as the first total transfer time or the second total transfer time.

11. The substrate processing system according to claim 8, further comprising:

an exposing apparatus; and a third transfer section configured to receive the substrates from the processing units and transfer the substrates to the exposing apparatus, wherein the controller sets the maximum among the first total transfer time, the second total transfer time, and a third total transfer time of the third transfer section as the one-cycle time.

12. A method of processing substrates with first to n-th processing unit groups, n being a positive integer, each unit group having at least one processing unit and being configured to perform first to n-th substrate processing for given periods t1 to tn, respectively, the method comprising:

processing the substrates in each processing unit, one by one, for a respective processing time that is less than or equal to a standard one-cycle time, the one-cycle time being a maximum period among pen t1/m to tn/m, m being a positive integer equal to the processing units actually present in each of the first to n-th processing unit groups, respectively, wherein the processing time of each processing unit includes a pre-transfer time, a net processing time, a post-transfer time, and a waiting time, and the controller adjusts the processing time of each processing unit in accordance with the one-cycle time.

* * * * *